United States Patent

Asai et al.

[11] Patent Number: 5,986,704
[45] Date of Patent: Nov. 16, 1999

[54] SOLID-STATE IMAGE PICKUP DEVICE, WITH PURPOSEFULLY DISPLACED COLOR FILTERS, METHOD OF MANUFACTURING SAME AND CAMERA INCORPORATING SAME

[75] Inventors: Atsushi Asai, Kanagawa; Kazushige Nigawara, Tokyo; Kouji Matsuzaki; Satoshi Kitayama, both of Kagoshima, all of Japan

[73] Assignee: Sony Corporation, Tokyo, Japan

[21] Appl. No.: 08/994,441

[22] Filed: Dec. 19, 1997

[30] Foreign Application Priority Data

Dec. 20, 1996 [JP] Japan ..................................... 8-355011

[51] Int. Cl.$^6$ .................................................. H04N 5/225

[52] U.S. Cl. ........................... 348/340; 257/435; 348/273

[58] Field of Search ..................................... 257/215, 294, 257/435; 348/275, 277, 279, 280, 273, 282, 340; 358/512; 250/208.1, 216

[56] References Cited

U.S. PATENT DOCUMENTS

| | | | |
|---|---|---|---|
| 4,561,015 | 12/1985 | Korch | 348/340 |
| 5,610,390 | 3/1997 | Miyano | 250/216 |
| 5,760,834 | 6/1998 | Rostoker | 348/340 |
| 5,798,542 | 8/1998 | Anagnostopoulos et al. | 257/294 |

*Primary Examiner*—Wendy Garber
*Assistant Examiner*—Alicin M. Harrington
*Attorney, Agent, or Firm*—Hill & Simpson

[57] ABSTRACT

The displacement amount of a color filter which is displaced with respect to an opening of a light-shielding film along the surface of a substrate increases as the distance from the substantial center of an image pickup region to the opening of the light-shielding film increases, and the height from the surface of the substrate to the substantial center in the direction of thickness of the color filter increases. For this reason, whole light incident on the sensor of each pixel can pass through only a corresponding color filter and also pass through the entire thickness of the color filter. Even when the thickness or height of the color filter changes in units of pixels, a high-quality image having no color irregularity can be obtained.

17 Claims, 10 Drawing Sheets

SOLID-STATE IMAGE PICKUP DEVICE, WITH PURPOSEFULLY DISPLACED COLOR FILTERS, METHOD OF MANUFACTURING SAME AND CAMERA INCORPORATING SAME

BACKGROUND OF THE INVENTION

1. Field of the Invention

The present invention relates to a solid-state image pickup device having a plurality of color filters corresponding to a plurality of pixels, a method of manufacturing the same and a camera having this solid-state image pickup device.

2. Description of the Related Art

FIG. 1 is a plan view of an entire CCD solid-state image pickup device of an interline transfer type. A chip 11 of this CCD solid-state image pickup device has an image pickup region 12 formed by arraying a plurality of pixels. FIG. 2 schematically shows a camera using the chip 11. In this camera, the image of light from a target object is formed in the image pickup region 12 of the chip 11 through an optical system 14 including a lens 13. The chip 11 of the CCD solid-state image pickup device is driven by a driving system 15 including a timing generator. The output signal from the chip 11 is converted into an image signal through various signal processing operations in a signal processing system 16. FIG. 3 is an enlarged view of a portion of the camera near the chip 11 and the optical system 14.

FIGS. 4A to 5B show a CCD solid-state image pickup device having an on-chip color filter for a complementary color system according to the first related art of the present invention.

FIGS. 4A and 5A show a central portion 12a of the image pickup region 12. FIGS. 4B and 5B show a peripheral portion 12b of the image pickup region 12. In this first related art, a p-type well 22 is formed in an Si substrate 21. A p-type region 23 as a hole accumulated region and an n-type region 24 closer to the surface of the Si substrate 21 than the p-type well 22 constitute a sensor 25.

A p-type region 26 adjacent to the sensor 25 serves as a read out portion, and an n-type region 27 adjacent to the p-type region 26 serves as a vertical transfer portion. A p-type well 31 is formed under the n-type region 27. A p-type region 32 adjacent to the n-type region 27 serves as a pixel separation portion. An $SiO_2$ film 33 as a gate insulating film is formed on the surface of the Si substrate 21. A polysilicon film 34 on the Si substrate 21 forms a transfer electrode.

The polysilicon film 34 is covered with an $SiO_2$ film 35 or the like as an insulating film. The Si substrate 21 and the $SiO_2$ film 35 are covered with an $SiO_2$ film 36 as a passivation film. A light-shielding film 37 consisting of an Al film, a W film or the like is formed on the $SiO_2$ film 36. An opening 37a corresponding to the sensor 25 is formed in the light-shielding film 37.

The light-shielding film 37 and so on are covered with an SiN or SiO film 41 as a passivation film. A planarizing film 42 is formed on the SiN or SiO film 41. A red filter 43a, a blue filter 43b and a yellow filter 43c on the planarizing film 42 are patterned into a checkerboard pattern corresponding to pixels, which constitute an on-chip color filter 43.

The on-chip color filter 43 of this first related art is used for a complementary system, so the blue filter 43b and the yellow filter 43c are stacked to form a green filter, as shown in FIGS. 4A and 4B. A planarizing film 44 and an on-chip lens 45 are sequentially formed on the on-chip color filter 43.

FIGS. 6A and 6B show a CCD solid-state image pickup device having an on-chip color filter for a primary color system according to the second related art of the present invention. The second related art substantially has the same arrangement as that of the first related art shown in FIGS. 4A to 5B except that the on-chip color filter 43 has a single-layer structure.

When the exit pupil of the lens 13 of the camera shown in FIGS. 2 and 3 is close to the chip 11, light 46 is incident on the on-chip lens 45 at the central portion 12a of the image pickup region 12 almost in parallel to the optical axis of the on-chip lens 45, as shown in FIGS. 4A and 6A. At the peripheral portion 12b of the image pickup region 12, however, the light 46 is incident on the on-chip lens 45 obliquely with respect to the optical axis of the on-chip lens 45, as shown in FIGS. 4B and 6B.

For this reason, in the first and second related arts, the optical axis of the on-chip lens 45 is made to match the center of the opening 37a of the light-shielding film 37 at the central portion 12a of the image pickup region 12, as shown in FIG. 5A, although the displacement amount between the optical axis of the on-chip lens 45 and the center of the opening 37a of the light-shielding film 37 is increased toward the peripheral portion 12b, as shown in FIG. 5B.

As is apparent from FIGS. 4B and 6B, the ratio of the light 46 which is focused by the on-chip lens 45 and made incident on the sensor 25 of each pixel is high even at the peripheral portion 12b. Therefore, shading due to the incident angle of the light 46, i.e., a phenomenon that the sensitivity gradually changes from the central portion to the peripheral portion on the image pickup output screen is suppressed.

Recently, the displacement amount between the on-chip lens 45 and the opening 37a at the peripheral portion 12b is increasing along with a reduction of the effective size of an optical system. When the exit pupil distance of a lens is 3 mm, the incident angle of the light 46 is about 50° and the displacement amount of the on-chip lens 45 almost reaches ½ the pixel pitch.

However, in the first and second related arts, the center of the on-chip color filter 43 of each pixel matches the center of the opening 37a even at the peripheral portion 12b, as shown in FIGS. 4B and 6B.

As is apparent from FIGS. 4B and 6B, the light 46 incident on the sensor 25 of each pixel passes through the on-chip color filter 43 of an adjacent pixel, resulting in a mixed color, or the light 46 passes through only part of the thickness of the on-chip color filter 43 of the pixel, resulting in a deviation of the spectral characteristics from desired characteristics. For this reason, in the first and second related arts, a high-quality image having no color irregularity can hardly be obtained.

To prevent color irregularity, displacement of the on-chip color filter 43 of each pixel from the opening 37a has also been examined. In this case, however, only the distance from the central portion 12a of the image pickup region 12 to the opening 37a of each pixel is taken into consideration, and the thickness of the on-chip color filter 43 or the height from the surface of the Si substrate 21 is not taken into consideration. For this reason, it is still difficult to obtain a high-quality image having no color irregularity.

SUMMARY OF THE INVENTION

According to a solid-state image pickup device, a method of manufacturing the device and a camera having the device of the present invention, the displacement amount of a color filter with respect to an opening of a light-shielding film is determined in accordance with both the distance from the substantial center of an image pickup region and the height from the surface of a substrate. For this reason, even when the thickness or height of the color filter changes in units of pixels, and light is incident through a lens having a short exit pupil distance, the whole light incident on the sensor of each pixel can pass through only a color filter corresponding to the pixel and can pass through the entire thickness of the color filter. Therefore, a high-quality image having no color irregularity can be obtained.

Even when the color filter has a multilayer structure, the whole light incident on the sensor of each pixel can readily pass through only a color filter corresponding to the pixel and can pass through the entire thickness of the color filter as far as the upper layer portion and the lower layer portion of the color filter have different displacement amounts with respect to the opening of the light-shielding film. Therefore, a high-quality image having no color irregularity can be easily obtained.

Even when the color filter has a single-layer structure in which the thickness of the color filter changes in units of colors, the whole light incident on the sensor of each pixel can pass through only a color filter corresponding to the pixel and can pass through the entire thickness of the color filter. Therefore, a high-quality image having no color irregularity can be obtained.

BRIEF DESCRIPTION OF THE DRAWINGS

FIGS. 4A and 4B are side sectional views of the first related art of the present invention, in which FIG. 4A shows the central portion of an image pickup region, and FIG. 4B shows the peripheral portion of the image pickup region;

FIGS. 5A and 5B are plan views of the first related art, in which FIG. 5A shows the central portion of the image pickup region, and FIG. 5B shows the peripheral portion of the image pickup region;

FIGS. 6A and 6B are side sectional views of the second related art of the present invention, in which FIG. 6A shows the central portion of an image pickup region, and FIG. 6B shows the peripheral portion of the image pickup region;

FIGS. 7A and 7B are side sectional views of the first embodiment of the present invention, in which FIG. 7A shows the central portion of an image pickup region, and FIG. 7B shows the peripheral portion of the image pickup region;

FIGS. 8A to 8C are plan views of the first embodiment, in which FIG. 8A shows the central portion of the image pickup region, FIG. 8B shows the peripheral portion of the image pickup region and FIG. 8C shows the corner portion of the image pickup region;

FIGS. 11A and 11B are side sectional views of the third embodiment of the present invention, in which FIG. 11A shows the central portion of an image pickup region, and FIG. 11B shows the peripheral portion of the image pickup region.

DETAILED DESCRIPTION OF THE PREFERRED EMBODIMENTS

The first to third embodiments of the present invention applied to a CCD solid-state image pickup device of an interline transfer type and a camera having the CCD solid-state image pickup device will be described below with reference to FIGS. 7A to 11B. The first to third embodiments have the same arrangement as in FIG. 1 as a whole.

Figure 7A:
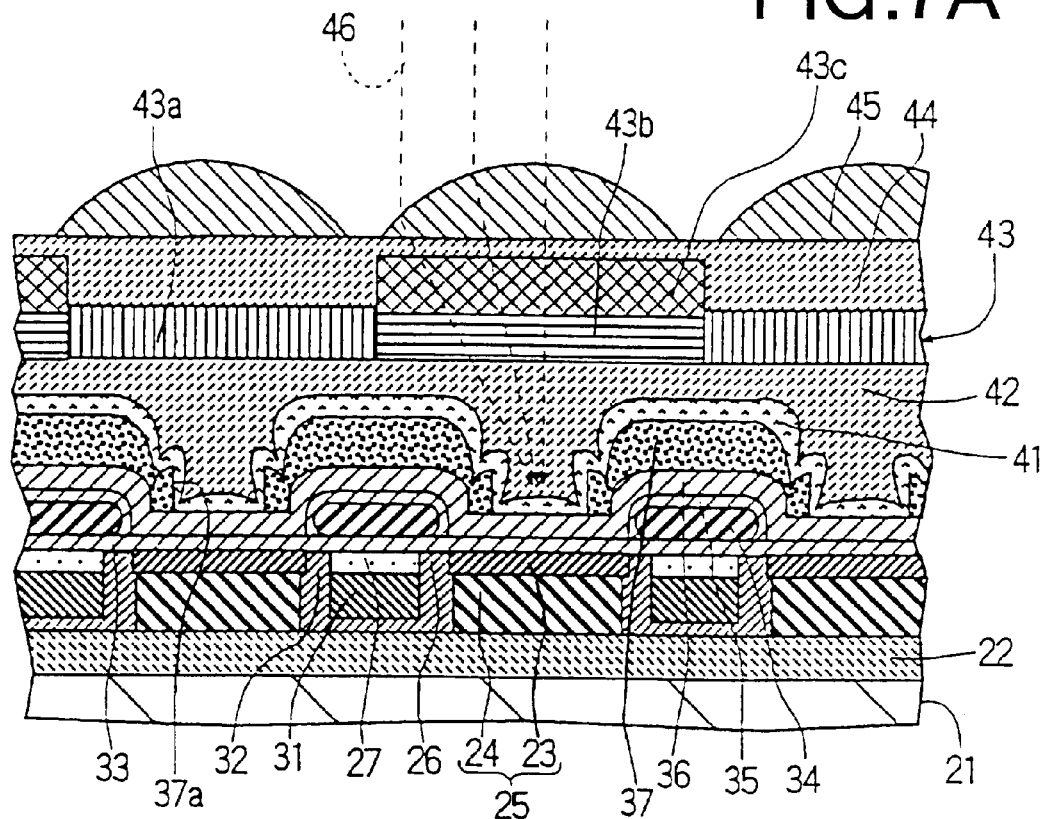

FIGS. 7A to 8C show the first embodiment having an on-chip color filter for a complementary color system. The first embodiment substantially has the same arrangement as that of the first related art shown in FIGS. 4A to 5B, so the optical axis of an on-chip lens 45 matches the center of an opening 37a of a light-shielding film 37 at a central portion 12a of an image pickup region 12, as shown in FIGS. 7A and 8A.

Figure 7B:
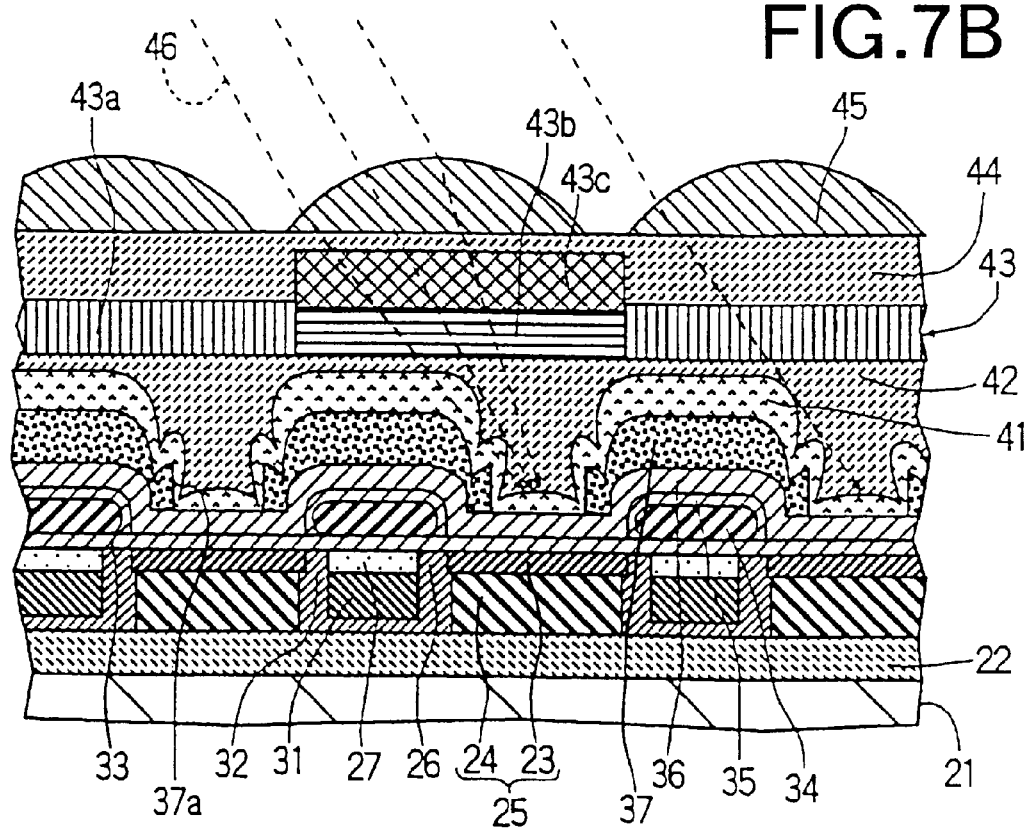
Figure 8A:
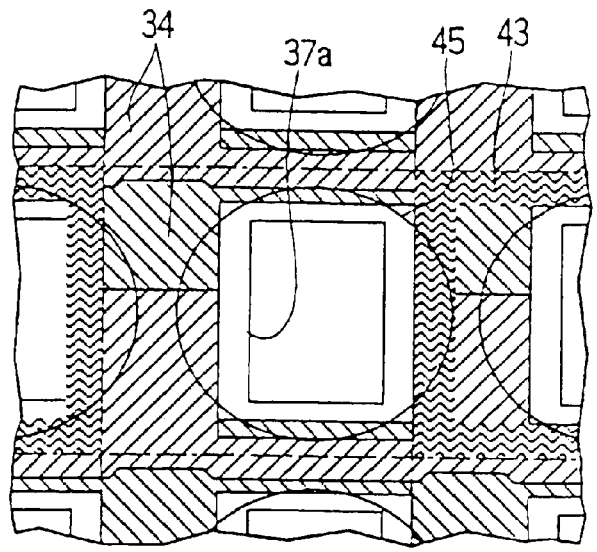
Figure 8B:
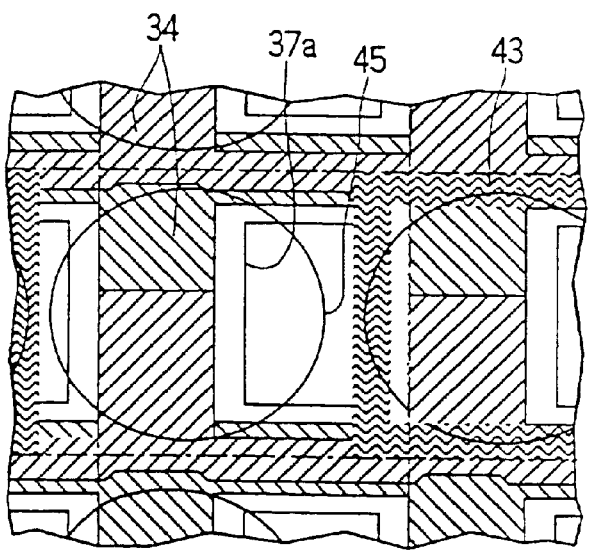

In the first embodiment, however, at a peripheral portion 12b of the image pickup region 12, not only the optical axis of the on-chip lens 45 but also the substantial center of an on-chip color filter 43 is displaced from the substantial center of the opening 37a of the light-shielding film 37, as shown in FIGS. 7B and 8B. The on-chip color filter 43 is displaced in the same direction as the displacement direction of the on-chip lens 45 although the displacement amount is smaller than that of the on-chip lens 45. The displacement amount of the on-chip color filter 43 corresponds to the distance from the substantial center of the opening 37a to the substantial center of the on-chip color filter 43 along the surface of the Si substrate 21.

Figure 1:
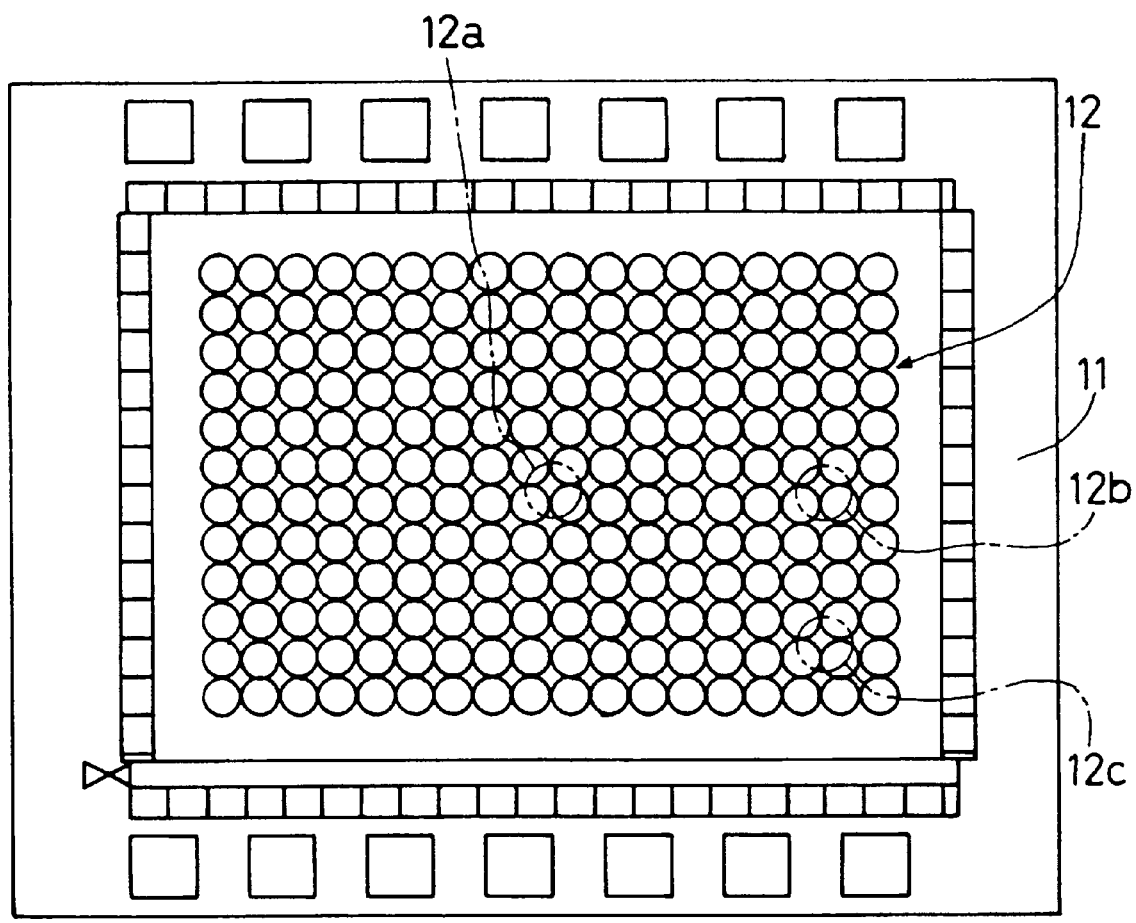
FIG. 1 is a plan view of the chip of a solid-state image pickup device to which the present invention can be applied.
Figures 2, 3:
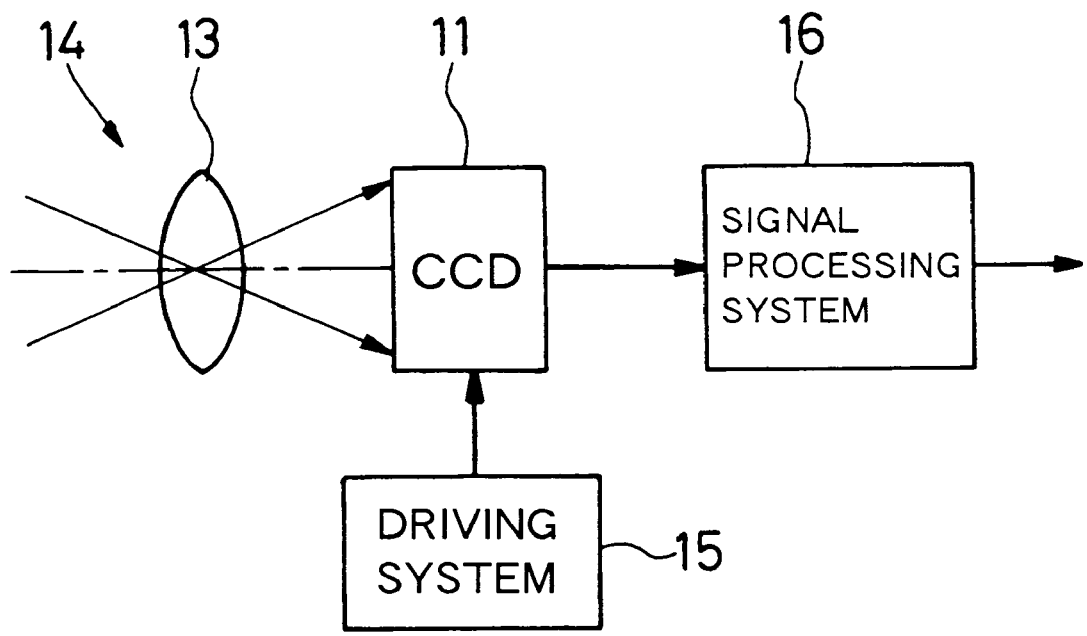
FIG. 2 is a schematic view of a camera to which the present invention can be applied.
FIG. 3 is an enlarged view of the camera shown in FIG. 2.
Figure 4A:
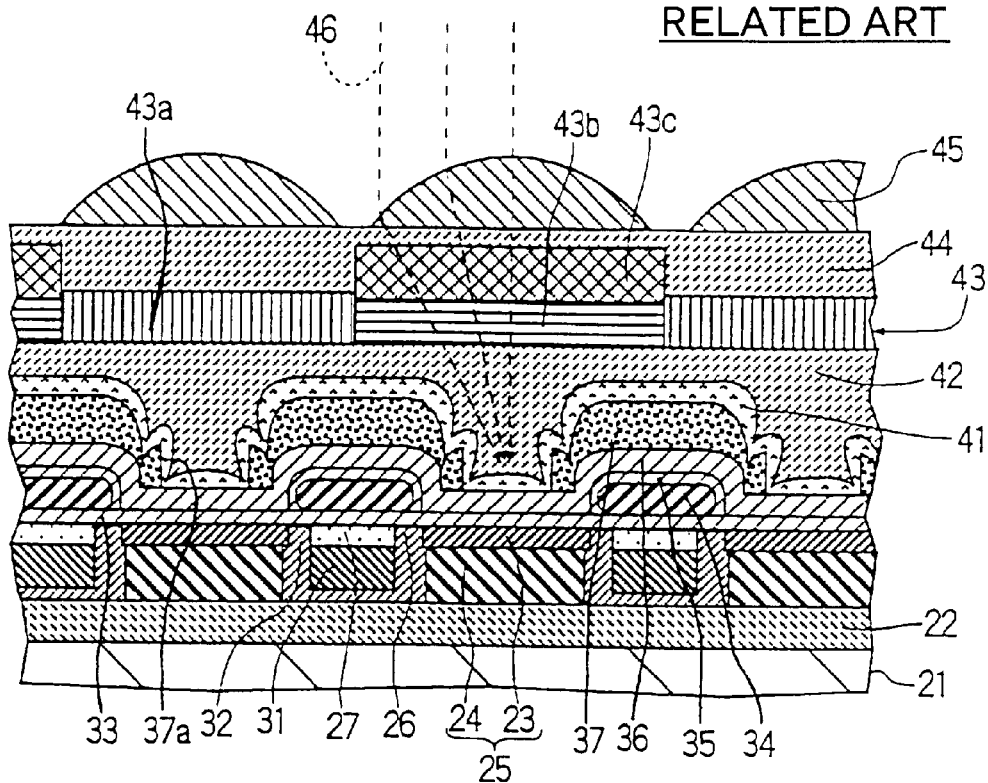
Figure 4B:
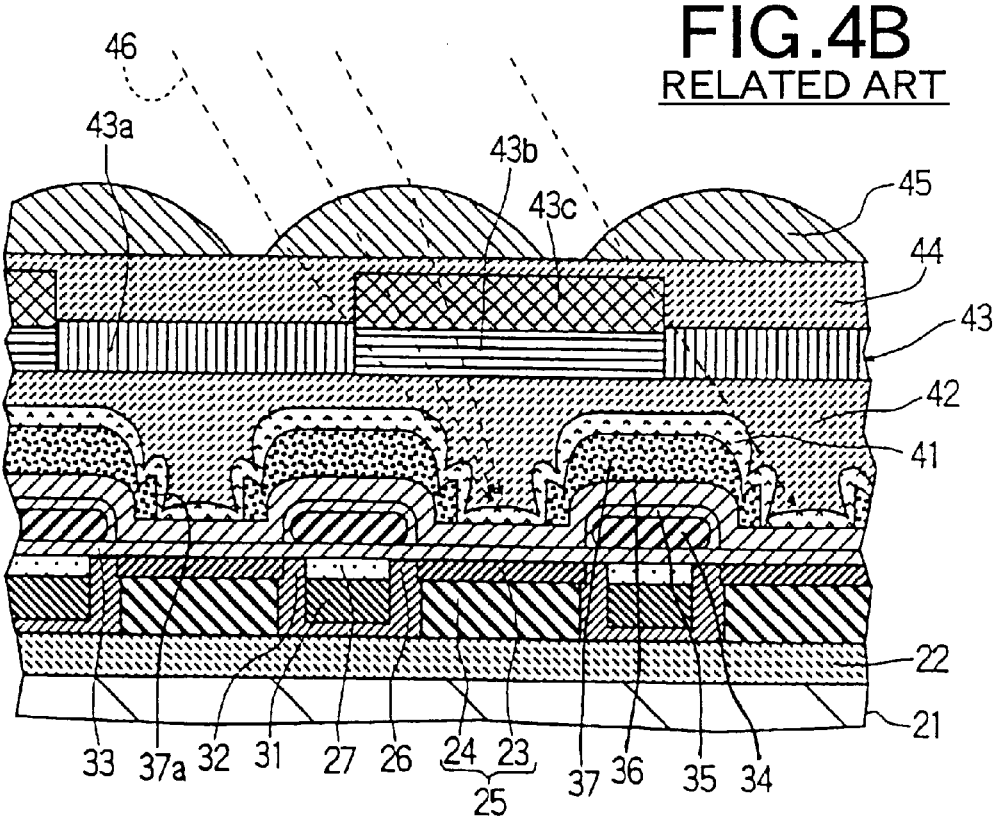
Figure 5A:
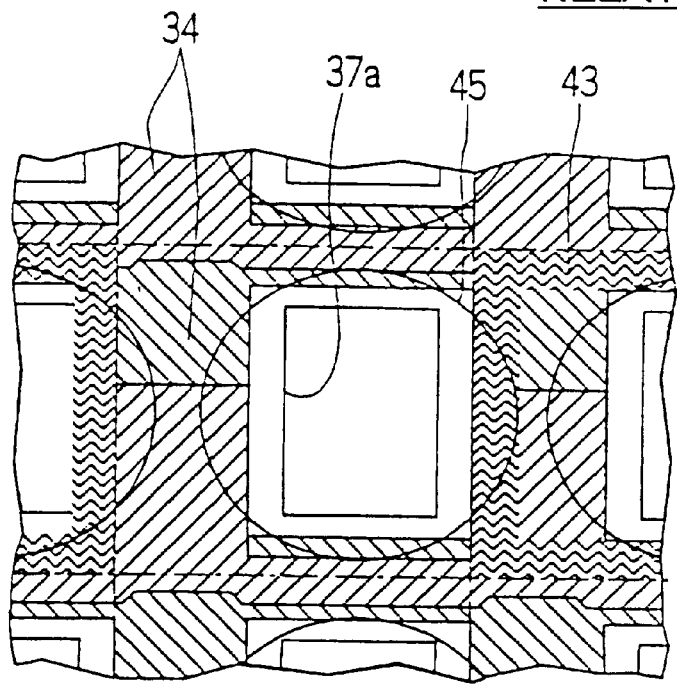
Figure 5B:
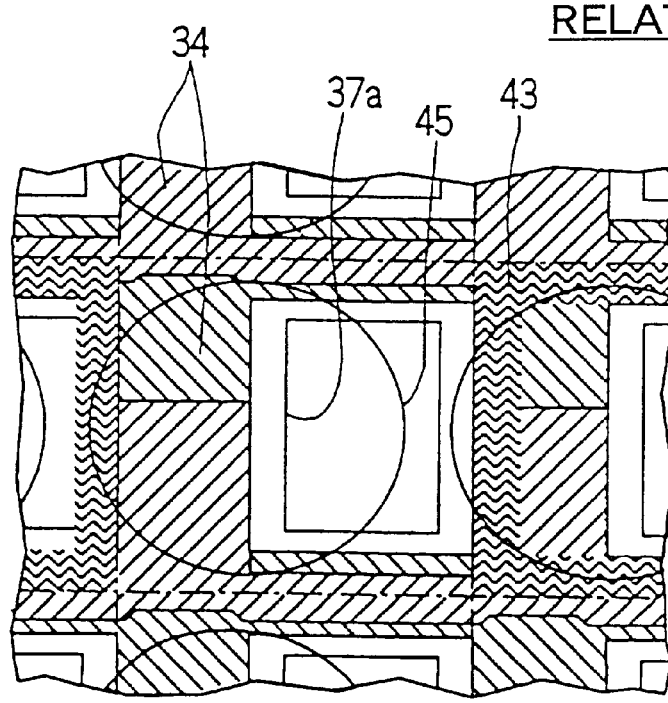
Figure 6A:
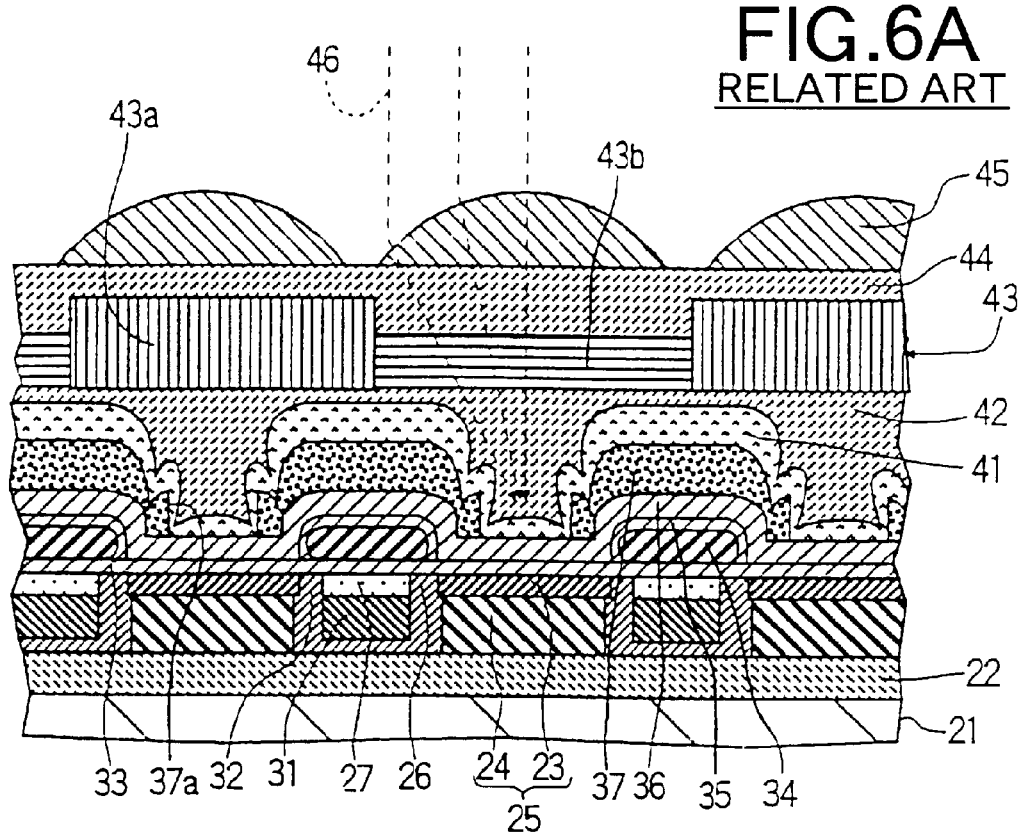
Figure 6B:
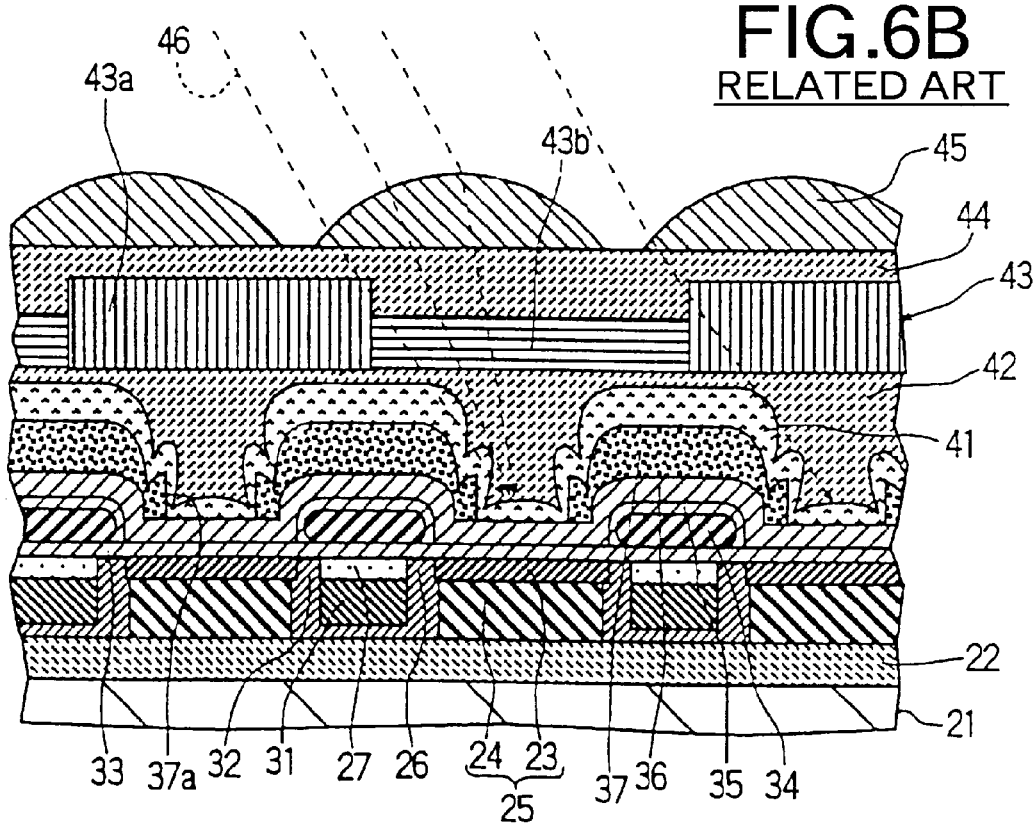

These displacement amounts increase toward the peripheral portion 12b. The displacement direction at a peripheral portion on an opposite side of the peripheral portion 12b of the image pickup region 12 is reverse to that at the peripheral portion 12b. The displacement direction at a corner portion 12c of the image pickup region 12 shown in FIG. 1 is not a one-dimensional direction as in FIG. 8B but a two-dimensional direction, as shown in FIG. 8C.

Figure 8C:
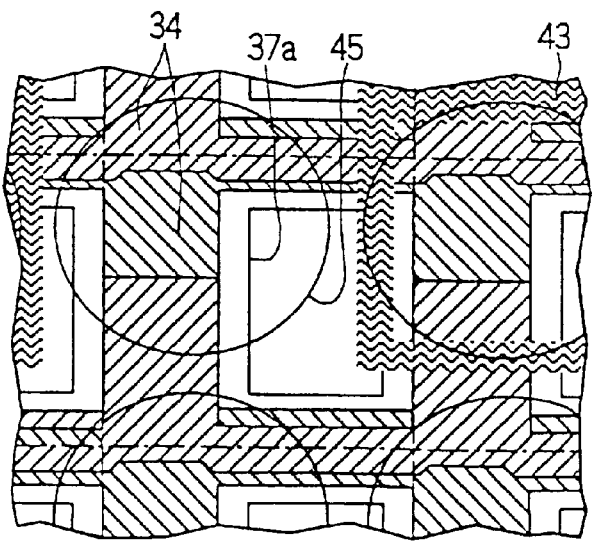

In FIGS. 7B, 8B and 8C, and in the second and third embodiments to be described later, the on-chip lens 45 and the on-chip color filter 43 are displaced by a uniform amount near the peripheral portion 12b and the corner portion 12c for the illustrative convenience. In fact, the displacement amount is determined in accordance with both the distance from the substantial center of the image pickup region 12 to the opening 37a of each pixel and the height from the surface of the Si substrate 21 to the substantial center in the direction of thickness of the on-chip color filter 43, so the displacement amount of a high on-chip color filter 43 is large.

Figure 9A:
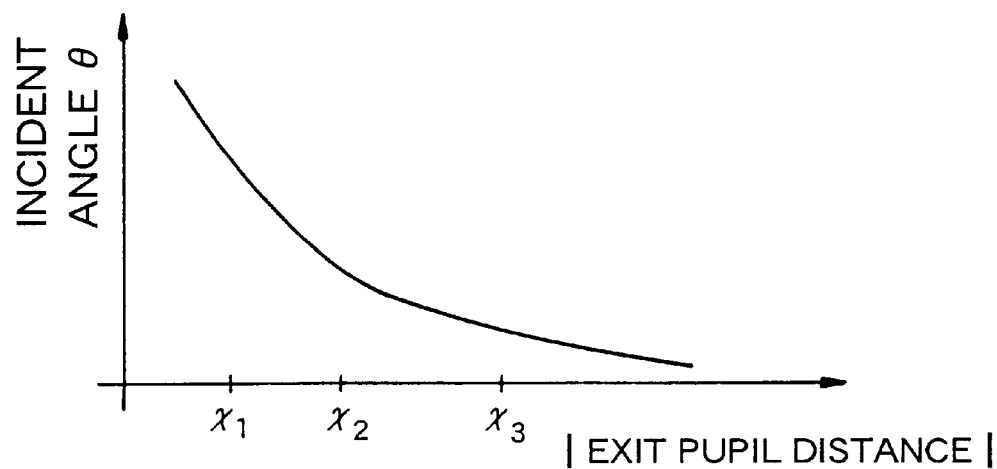
FIG. 9A is a graph showing the relationship between the absolute value of the exit pupil distance of a lens and the incident angle of light incident on the peripheral portion of the image pickup region.

More specifically, as the absolute value of the exit pupil distance decreases, the incident angle of light 46 incident on the peripheral portion 12b of the image pickup region 12 increases, as shown in FIG. 9A. However, as the absolute value of the exit pupil distance decreases, and the height from the surface of the Si substrate 21 to the substantial center in the direction of thickness of the on-chip color filter 43 increases, the displacement amount of the on-chip color filter 43 becomes large, as shown in FIGS. 9B and 9C.

More specifically, a normal camera has an exit pupil distance of about −20 mm. In the first embodiment, if the exit pupil distance is, e.g., −3 mm, and the incident angle of the light 46 is large, the displacement amount of the on-chip color filter 43 is increased. Therefore, a high-quality image can be obtained even with a camera such as an endoscope having a short exit pupil distance.

Figure 9B:
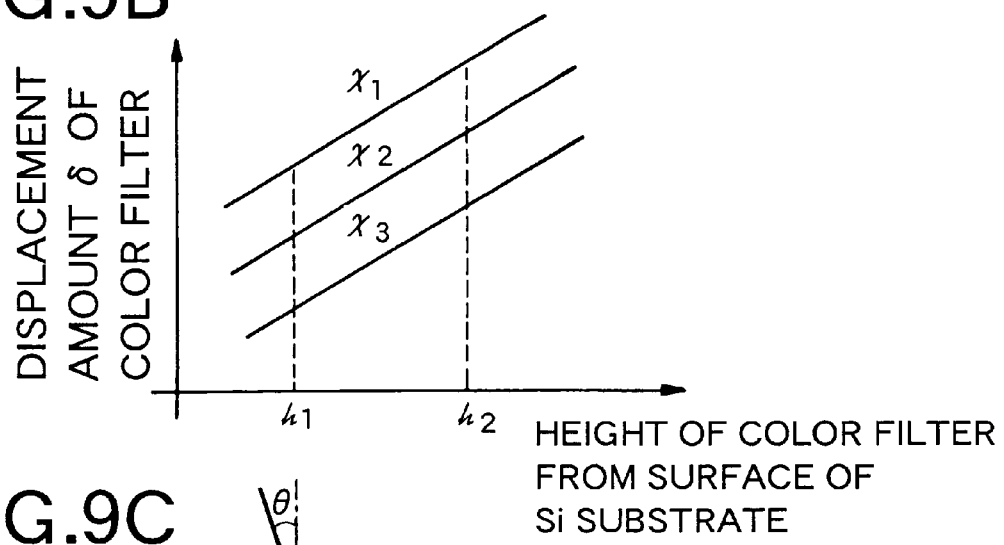
FIG. 9B is a graph showing the relationship among the height of a color filter from the surface of a substrate, the absolute value of the exit pupil distance of the lens and the displacement amount of the color filter in the first embodiment.
Figure 9C:
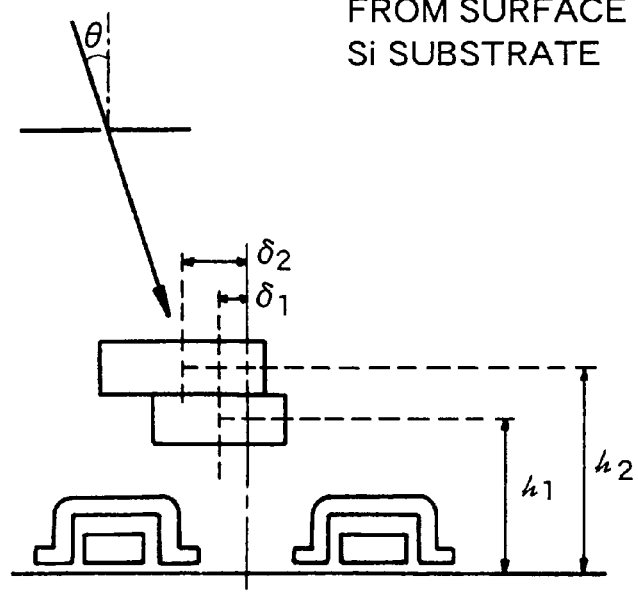
FIG. 9C is a schematic view for explaining the relationship between the height of the color filter and the displacement amount of the color filter in the first embodiment.

As is apparent from FIG. 9B, the height of the on-chip color filter 43 is substantially proportional to its displacement amount. As a specific value of the displacement amount of the on-chip color filter 43, a median value between a displacement amount of zero and the displacement amount of the on-chip lens 45 is employed to most effectively guide the light 46 focused by the on-chip lens 45 to a sensor 25.

The on-chip color filter 43 can be formed by a conventionally known technique of dying casein or gelatin or patterning a photosensitive material mixed with coloring agents. The on-chip lens 45 can also be formed by a conventionally known technique.

In the above-described first embodiment, the light 46 incident on the sensor 25 of each pixel is prevented from passing through the on-chip color filter 43 of an adjacent pixel, and simultaneously, the light 46 is prevented from passing through only part of the thickness of the on-chip color filter 43 of the pixel, as is apparent from FIG. 7B, so a high-quality image having no color irregularity can be obtained.

Figure 10:
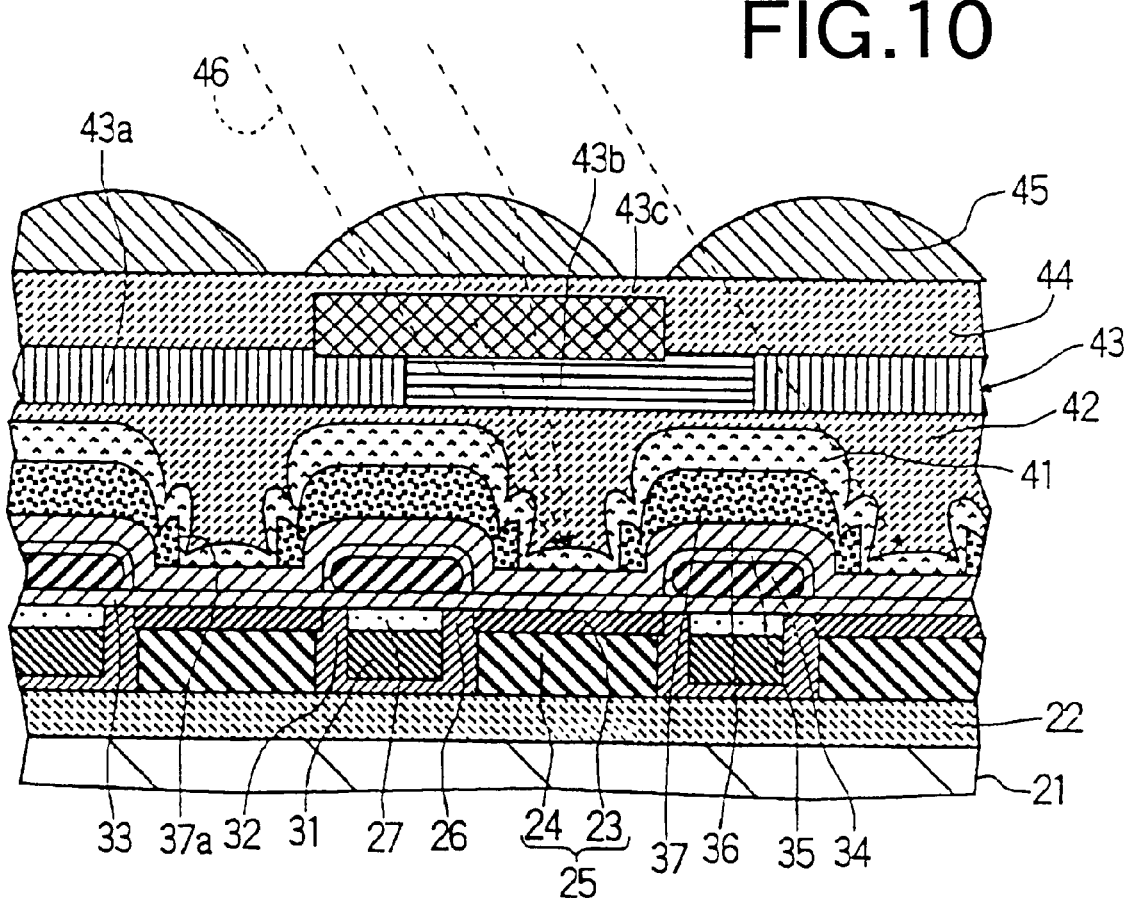
FIG. 10 is a side sectional view of the second embodiment of the present invention and, more particularly, the peripheral portion of an image pickup region.

FIG. 10 shows a peripheral portion 12b of an image pickup region 12, which is shown in FIG. 1, of the second embodiment having an on-chip color filter for a complementary color system. The second embodiment substantially has the same arrangement as that of the first embodiment shown in FIGS. 7A to 8C except that a blue filter 43b and a yellow filter 43c which constitute a green filter have different displacement amounts, and the displacement amount of the yellow filter 43c on the upper side is larger than that of the blue filter 43b on the lower side.

In the second embodiment, the displacement amounts of the blue filter 43b and the yellow filter 43c can be independently determined. For this reason, it is easier than in the first embodiment to prevent light 46 incident on a sensor 25 of each pixel from passing through an on-chip color filter 43 of an adjacent pixel or prevent the light 46 from passing through only part of the thickness of the on-chip color filter 43 of the pixel, as is apparent from FIG. 10.

Figure 11A:
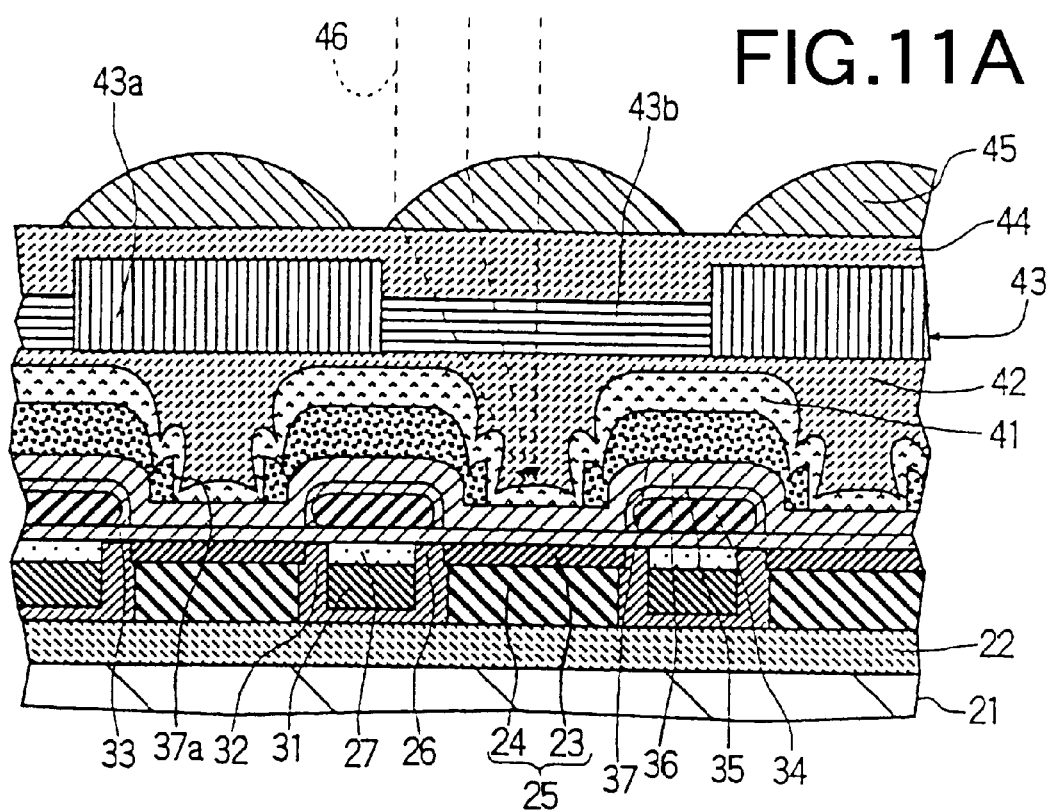
Figure 11B:
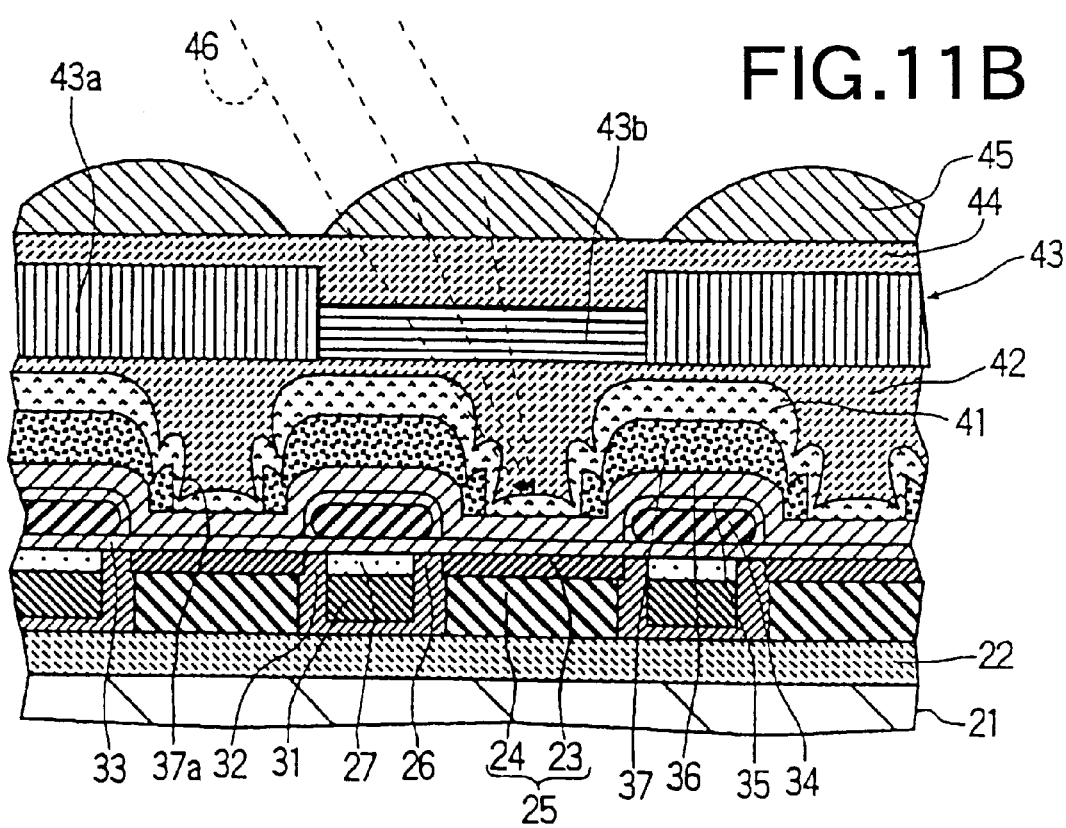

FIGS. 11A and 11B show the third embodiment having an on-chip color filter for a primary color system. The third embodiment also has the same arrangement as that of the first embodiment shown in FIGS. 7A to 8C except that an on-chip color filter 43 has a single-layer structure.

In the above first to third embodiments, the height from the surface of the Si substrate 21 to the lower surface of the on-chip color filter 43 is equal for all pixels because of a planarizing film 42. Even when this height changes in units of pixels due to some reason, the displacement amount of the on-chip color filter 43 is determined in accordance with the height from the surface of the Si substrate 21 to the substantial center in the direction of thickness of the on-chip color filter 43, so a high-quality image having no color irregularity can be obtained.

In the first to third embodiments, as is apparent from a comparison of the position of the peripheral portion 12b of the image pickup region 12 between FIG. 7B and FIG. 1, the on-chip color filter 43 is displaced along a direction from the substantial center of the opening 37a of the light-shielding film 37 to the central portion 12a of the image pickup region 12.

However, when the size of the lens of, e.g., a video camera is much larger than that of the image pickup region 12, and the lens is mounted close to a chip 11, i.e., when the lens has a positive exit pupil, the on-chip color filter 43 may be displaced in a direction reverse to that in the first to third embodiments.

What is claimed is:

1. A solid-state image pickup device in which an image pickup region formed by arraying a plurality of pixels is formed on a substrate, a light-shielding film having an opening on a sensor of each of said pixels is formed on said substrate, and a plurality of color filters corresponding to said plurality of pixels are formed on said light-shielding film, wherein a displacement amount of said color filter which is displaced with respect to the opening along a surface of said substrate increases as a distance from a substantial center of said image pickup region to the opening increases, and a height from said surface to a substantial center in a direction of thickness of said color filter increases.

2. A device according to claim 1, wherein said color filter has a multilayer structure, and an upper layer portion and a lower layer portion of said color filter have different displacement amounts.

3. A device according to claim 1, wherein said color filter has a single-layer structure, and the thickness of said color filter changes in units of colors.

4. A device according to claim 1, wherein the displacement amount is proportional to the height.

5. A device according to claim 1, wherein a plurality of lenses corresponding to said plurality of pixels are arranged on said plurality of color filters, and the displacement amount of said color filter is less than that of said lens which is displaced with respect to the opening along said surface of said substrate.

6. A camera comprising:

a solid-state image pickup device having an image pickup region formed by arraying a plurality of pixels on a substrate; a light-shielding film formed on said substrate and having an opening on a sensor of each of said pixels; a plurality of color filters formed on said light-shielding film in correspondence with said plurality of pixels; and a plurality of lenses formed on said color filters in correspondence with said plurality of pixels;

an optical system for forming an image of light incident from a target object on said image pickup region of said solid-state image pickup device;

a driving system for driving said solid-state image pickup device; and a signal processing system for processing an output signal from said solid-state image pickup device, wherein a displacement amount of said color filter which is displaced with respect to the opening along a surface of said substrate increases as a distance from a substantial center of said image pickup region to the opening increases, and a height from said surface to a substantial center in a direction of thickness of said color filter increases.

7. A camera according to claim 6, wherein as an incident angle of the light, which is obtained from an exit pupil of said optical system, is large, the displacement amount of said color filter becomes large.

8. A camera according to claim 6, wherein said color filter has a multilayer structure, and an upper layer portion and a lower layer portion of said color filter have different displacement amounts.

9. A camera according to claim 6, wherein said color filter has a single-layer structure, and the thickness of said color filter changes in units of colors.

10. A camera according to claim 6, wherein the displacement amount of said color filter is proportional to the height.

11. A camera according to claim 6, wherein the displacement amount of said color filter is not more than that of said lens which is displaced with respect to the opening along said surface of said substrate.

12. A method of manufacturing a solid-state image pickup device having:

an image pickup region formed by arraying a plurality of pixels on a substrate;

a light-shielding film formed on said substrate and having an opening on a sensor of each of said pixels;

a plurality of color filters formed on said light-shielding film in correspondence with said plurality of pixels; and a plurality of lenses formed on said color filters in correspondence with said plurality of pixels, comprising the step of:

increasing a displacement amount of said color filter which is displaced with respect to the opening along a surface of said substrate as a distance from a substantial center of said image pickup region to the opening increases, and a height from said surface to a substantial center in a direction of thickness of said color filter increases.

13. A method according to claim 12, wherein as an incident angle of light incident from a target object, which is obtained from an exit pupil of an optical system for forming an image of the light on said image pickup region, is large, the displacement amount of said color filter becomes large.

14. A method according to claim 12, wherein said color filter has a multilayer structure, and an upper layer portion and a lower layer portion of said color filter have different displacement amounts.

15. A method according to claim 12, wherein said color filter has a single-layer structure, and the thickness of said color filter changes in units of colors.

16. A method according to claim 12, wherein the displacement amount of said color filter is proportional to the height.

17. A method according to claim 12, wherein the displacement amount of said color filter is not more than that of said lens which is displaced with respect to the opening along said surface of said substrate.

* * * * *